United States Patent [19]

Baechtold et al.

[11] 3,953,749
[45] Apr. 27, 1976

[54] BINARY CIRCUITRY INCLUDING SWITCHING ELEMENTS UTILIZING SUPERCONDUCTIVE TUNNELING EFFECTS

[75] Inventors: Werner Baechtold, Somers, N.Y.; Pierre L. Gueret, Richterswil, Switzerland

[73] Assignee: International Business Machines Corporation, Armonk, N.Y.

[22] Filed: Dec. 2, 1974

[21] Appl. No.: 528,963

[30] Foreign Application Priority Data
Dec. 13, 1973 Switzerland.................... 17501/73

[52] U.S. Cl.............................. 307/277; 307/212; 307/306; 357/5
[51] Int. Cl.² .................................... H03K 3/38
[58] Field of Search .......... 307/245, 212, 277, 306; 357/5

[56] References Cited
UNITED STATES PATENTS

| | | | |
|---|---|---|---|
| 3,093,749 | 6/1963 | Dillingham | 307/277 |
| 3,458,735 | 7/1969 | Fiske | 307/212 X |

OTHER PUBLICATIONS

IBM Technical Disclosure Bulletin, Vol. 15, No. 11, Apr. 1973, pp. 3561–3562, "Josephson Device Level Converter", by H. C. Hamel

*Primary Examiner*—John Zazworsky
*Attorney, Agent, or Firm*—Thomas J. Kilgannon, Jr.

[57] ABSTRACT

Two Josephson gates are connected in series to a low impedance voltage source. Each junction is bridged by a load impedance. The feed voltage is maintained in the order of the gap voltage which corresponds to the voltage drop across a Josephson junction when it is in its single-particle-tunneling state. Therefore, only one out of both Josephson elements can exist in the voltage state at a time, and the other junction is forced to assume the superconducting pair-tunneling state.

In its symmetric form, the basic circuit can be used as flip-flop or storage means. If asymmetric, the basic circuit shows monostable switching behavior, and it can be used as logic gate. Circuit asymmetry can be caused either by design using different junction areas or electrically by proper bias control currents applied to either or both gates of the basic circuit. The degree of symmetry or asymmetry can even be shifted with electrical means. AND and OR gates and inverting embodiments which perform logic NAND and NOR functions are shown.

27 Claims, 16 Drawing Figures

BINARY CIRCUITRY INCLUDING SWITCHING ELEMENTS UTILIZING SUPERCONDUCTIVE TUNNELING EFFECTS

BACKGROUND OF THE INVENTION

1. Field of the Invention

The invention relates to binary circuitry including switching elements utilizing superconductive tunneling effects, for storing and/or connecting binary coded data logically.

Binary circuits can be used in all kinds of apparatus and devices for processing binary coded date. These may be computer systems, telephone central offices, or any other system for the transmission of binary data. If the switching behavior of such circuits is bistable, one can design therefrom memories, shift registers, counters or like apparatus. If the switching behavior of such circuits is monostable, they reset automatically to their initial state after cessation of input signals. Particularly such binary circuits are useful in designing logical connective circuits of all kinds.

2. Description of the Prior Art

The term superconductivity means the complete disappearance of electrical sensitivity of a number of metals and alloys at very low temperatures near absolute zero. Superconductivity occurs suddenly below a certain temperature. This so called critical temperature differs from material to material. Binary switching elements known as cryotrons utilize the transition of the material from the superconducting state to the normal state and vice-versa. The alternate generation and destruction of superconductivity by controlling currents or magnetic fields effects a phase transition in at least one of the materials of the cryotron. This phase transition starts at nucleation centers and spreads over the cross section until the whole material exists in the new phase. Of course, such a phase transition consumes a certain period of time and such transients proceed relatively slowly when compared with known devices. A serious drawback of the cryotron is also the fact that the material exhibits an ohmic resitivity in the normal conducting state, and, therefore, the power dissipation can no longer be neglected.

If two superconductors are separated by a thin, non-superconducting layer, electrons may cross that potential threshold by the action of driving fields, although such a threshold should not be possible to overcome, strictly speaking. Electrons cross it by tunneling through the potential barrier. Hence, this effect is called the tunneling effect. Single electrons or quasi-particles may tunnel through such barriers, and in so doing cause a potential drop corresponding to the value of the gap voltage. In the band model of electrons, this energy gap corresponds to the separation of two bands representing possible energy states, which separation is measured in units of energy. The energy gap is a property of matter and varies from material to material. However, besides this quasi-particle tunneling effect, there exists a further superconductive tunneling effect involving bound electron pairs. In a superconductive metal, the prevailing charge carriers involved are electron pairs coupled with the lattice by the electron phonon interaction. Such electron pairs are called Cooper pairs. Now it has been predicted by B. D. Josephson that, in sufficiently thin insulating layers between two adjacent superconductive metals, a tunneling effect involving Cooper pairs as carriers occurs. When Josephson tunneling occurs, the insulating material behaves like a superconductive metal but with zero voltage drop. The basic paper is an article entitled "Possible New Effects in Superconductive Tunneling" published by B. D. Josephson in Physics Letters, Vol. 1, No. 7, July 1962, pp. 251–253. The predicted effects have been found and since have been utilized in many technical applications. A good survey of the history, tehcniques, devices and circuits involved is shown in the book by L. Solymar, "Superconductive Tunneling and Applications", published by Chapman and Hall, London, in the year 1972.

Generally josephson elements are called Josephson junctions, i.e., the barrier to be overcome by the tunneling currents consists of a thin oxide layer between two superconductive leads. At least one control line is provided for controlling the switching behavior of the element. A similar switching behavior is also shown by switching elements weakly coupling two superconductors. In such elements, the oxide layer is replaced, e.g., by a weak link. Superconductive Josephson elements are operating at temperatures of a few degrees Kelvin, and they can take two different states depending on the device current. In the region below the so called maximum Josephson current, $I_{max}$, a Cooper pair tunneling current flows. This is called pair tunneling, and the voltage drop across the element equals zero. The element is in the superconductive state. When the current value $I_{max}$ is exceeded, the element switches to another or voltage state. The current flowing in the device under such circumstances is also a tunneling current which, however, involves essentially single charge carriers or quasi-particles. The particle tunneling process is accompanied by a voltage drop which corresponds to the energy gap voltage, $V_G$.

For simplicity, this state may be called "normal conducting." This so called normal conducting state of a Josephson element should not be confused with the normal conducting state of the cryotron mentioned above. In that case, the normal conducting state is connected with a phase transition of the metal. In the normal conducting state of a Josephson element, the leads remain in the superconducting state, and particle tunneling current flows across the insulating interface. In Josephson elements, a very small voltage drop occurs which results in little heat dissipation. When the device current is reduced after switching into the normal conducting state, a hysteresis effect occurs, i.e., resetting by changing to the superconducting state occurs at a current value considerably below the value $I_{max}$. The maximum Josephson current value $I_{max}$ can be influenced by controlling externally applied magnetic fields which are generated by currents through associated control lines. A graph of the maximum Josephson current value versus the external magnetic field or the control current can take different forms depending on whether or not short Josephson junctions or long Josephson junctions are involved.

Because Josephson elements can take two distinguishable states, they can be utilized in binary circuits. In U.S. Pat. No. 3,281,609, issued oct. 25, 1966, a superconductive switching element utilizing tunneling effects is described. Input current are applied to a Josephson junction. If the current flowing through the Josephson junction exceeds the maximum Josephson current value, the junction switches to the normal conducting state. The resulting output current flows through a load resistance connected in parallel to the Josephson junction. However, it is not shown in this patent how such circuits operate in connection with succeeding logic circuits. U.S. Pat. No. 3,626,391, issued Dec. 7, 1971, describes an example of the application of Josephson elements in binary storage devices. The binary values are represented by the direction of circulating currents in associated superconducting loops. Sensing of the storage binary values is also effected by Josephson elements.

A paper by J. Matisoo entitled "The Tunneling Cryotron — A superconductive Logic Element Based on Electron Tunneling" describes the application of Josephson elements as logic gate. It appeared in Proceedings of the IEEE, Vol. 55, No. 2, February 1967. This paper describes essentially the switching behavior of a single element. Only one example sketched in a figure suggests controlling the current distribution in both branches of a superconducting loop. Other logic circuits are not shown in that publication.

In U.S. application Ser. No. 267,841 filed June 30, 1973, a binary logic circuit has been proposed using Josephson elements whereby a line terminated with its characteristic impedance is connected in parallel with a Josephson device. In the superconducting state, the current flow essentially through the Josephson junction, but, in the normal conducting state, current is diverted through the line. Succeeding Josephson devices can be controlled by the current in this line. However, this kind of logic circuit is not self-resetting. To reset such Josephson elements to the superconducting state, it is necessary to momentarily interrupt the current flowing through the Josephson device. This resetting mode is time-comsuming and, therefore, decreases the speed of the switching circuits severely. An adjustable delay circuit using that technique is shown in IBM Technical Disclosure Bulletin, Vol. 16, No. 1, June 1973, pp. 347–348. Two such logic circuits with output lines terminated by their characteristic impedance are connected in series, namely an OR gate and an AND gate. The delay period can be adjusted by changing the bias at one input of the AND gate.

A Josephson element as self-resetting logic gate has been proposed in Swiss Pat. application No. 16.755/72 filed Nov. 17, 1972. In this application, switching behavior of a Josephson element is effected by proper design of operating parameters. However, this method requires an extremely high current density within the Josephson junction and tight tolerances which are difficult to meet in the practice.

In the year 1960, a switching circuit operating at room temperature using two identical switching elements connected in series was published. E. Goto et al published the paper "Esaki Diode High-Speed Logical Circuits" in IRE Transactions on Electronic Computers, Vol. EC-9, No. 1, March 1960, pp. 25–29. The paper describes the so called Goto pair or the Esaki diode twin circuit. If this circuit is connected to a constant voltage, it has two stable operating points. that constant voltage feeding the series connection of two tunnel diodes distributes among each circuit element in a different way. Whether the larger voltage drop occurs at the one or the other of the tunnel diodes depends on the control circuit being fed to the node between both diodes at the moment when the circuit is connected to the constant voltage. Pulse operation only is possible because the feeding voltage must be applied anew for every switching operation.

Two Josephson elements connected in series in a level converter circuit were shown in the IBM Technical Disclosure Buletin, Vol. 15, No. 11, pp. 3561–3562, April 1973. That circuit changes unipolar input pulses into bipolar output pulses. The series connection is fed by a pulse current source delivering timing pulses. The unipolar input signals are sent through a control line associated with both Josephson elements. By adjusting portions of the control line, one Josephson element experiences control current in one direction with the other Josephson element experiences control current in the opposite direction. Coincident control and timing pulses cause an output signal of the one polarity, a timing pulse occurring along causes an output signal of the other polarity.

SUMMARY OF THE INVENTION

In accordance with the broadest aspect of the present invention, the circuit shown herein involves the utilization of a pair of series connected Josephson elements, a load impedance shunting each of the pair of Josephson elements, constant voltage means connected to the pair of Josephson devices and a common connection disposed between the load impedances and the Josephson devices.

In accordance with broader aspects, the circuit further utilizes control means electromagnetically coupled to each of the Josephson devices for switching at least one of the Josephson devices from one voltage state to another voltage state.

In accordance with still another aspect of the invention, a binary circuitry including switching elements utilizing superconductive tunneling effect is characterized in that there is provided at least one basic circuit comprising a pair of series connected Josephson elements each being shunted by a load impedance, which series connection is connected to a low impedance voltage source which delivers a constant voltage corresponding to the gap voltage such that only one of the Josephson elements can exist in the voltage state at a time while the other Josephson device is in the superconducting state. In addition, control means connected to an input signal source is utilized to control the switching behavior of at least one of the Josephson elements of said series connection. Under such circumstances, the voltage appearing across one of said Josephson element load impedances or the current therethrough is usable as an output signal.

It is, therefore, an object of the present invention to provide a binary circuit including switching elements utilizing superconductive tunneling effects, which is useful for the storage and/or logical connection of binary coded data according to its respective design.

Another object is to eliminate the drawbacks of known devices, especially the necessity for pulse operation with a separate reset step.

A further object is to provide a trigger circuit which operates in a bistable or monostable mode. This implies that in applications where the circuit is used as logical gate that the circuit is self-resetting, i.e., it resets to its initial condition as soon as input signals are removed.

Still another object is to provide a circuit wherein the current densities within the Josephson junction have values such that the operational parameters have wide tolerances.

A further object of the invention is to provide a binary circuit which controls a large number of succeeding logical circuits, that is, the circuit has large fan-out capabilities.

The foregoing and other objects, features and advantages of the invention will be apparent from the following more particular description of a preferred embodiment of the invention as illustrated in the accompanying drawings.

DESCRIPTION OF A PREFERRED EMBODIMENT

Figure 1:
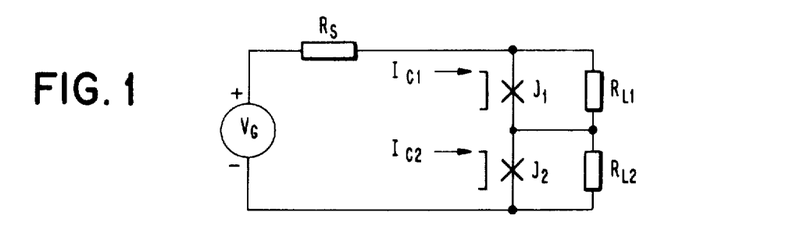
FIG. 1 shows a schematic circuit diagram of the elements of the basic circuit according to the invention.

FIG. 1 shows schematically the elements of the basic circuit of the binary circuitry according to the invention. A voltage source, $V_G$, with a source impedance, $R_S$, which, for the present, is assumed to be merely ohmic delivers a voltage to two Josephson elements $J_1$ and $J_2$ which are connected in series. A load, $R_{L1}$, is connected in parallel to the first Josephson element, $J_1$; a similar load, $R_{L2}$, is connected in parallel to the second Josephson element, $J_2$. Each of elements $J_1$, $J_2$, can be switched by the application of control currents, $I_{c1}$ or $I_{c2}$, respectively. Here the designation, $I_{c1}$, means the effective control current for the first Josephson element, $J_1$. The Josephson elements, $J_1$, $J_2$, may be Josephson gates with one or more control lines over the Josephson junction. These control lines may run in the same direction as the junction leads, or they may run transverse to it. Therefore, the effective control current indicated by an arrow in FIG. 1 may be the sum of all control currents in the control lines, even though the direction of current flow in parallel control lines may be directed oppositely to other control lines. It is also possible to couple the control currents galvanically and to send them over the Josephson junction through a single control line. The feeding voltage, $V_G$, should correspond practically to the energy gap voltage of a Josephson element. This voltage then distributes across the series connection unequally, such that a voltage drop occurs across the first Josephson element while the second Josephson element is superconducting, or vice versa. In any event, it is not possible that both series connected Josephson elements can exist in the voltage state, i.e., the normal conducting state, at the same time.

Figure 2:
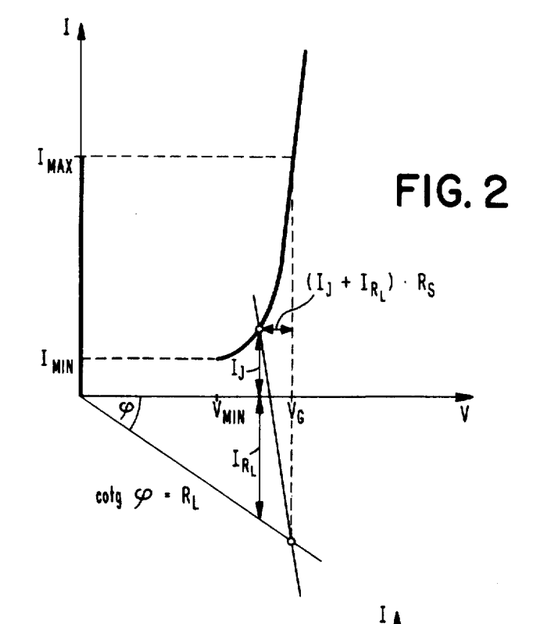
FIG. 2 shows the static characteristic of a Josephson element which indicates its switching behavior, and further shows graphically the operating point of a Josephson element in its normal conducting state.

FIG. 2 shows the static current-voltage characteristic of a Josephson element in arbitrary units. When the element is in the superconducting state, no voltage occurs across the Josephson junction. This state is indicated by that branch of the characteristic which coincides with the ordinate axis. At voltage zero, Josephson current can flow until a maximum current value $I_{max}$. This maximum Josephson current value depends on an external magnetic field which can also be delivered by a control current. If the maximum Josephson current is exceeded, or the maximum possible current value is decreased by an external field, then the Josephson junction switches — via dashed lines — to the normal conducting state at the energy gap voltage, $V_G$. If the feeding current, I, is decreased, resetting to the superconducting state occurs — via dashed lines -at a minimum current value $I_{MIN}$ and at a related reset voltage $V_{MIN}$. The values of reset voltage, and reset current as well as the form of the characteristic may be strongly dependent on the impedances present in the circuit. For instance, the reset point may be not clearly defined in the case of a very low source impedance, so that definite resetting is only possible by switching off the feeding current. However, a well defined reset point, in spite of low load and source impedances, can be achieved by the insertion of inductances into the circuit.

The operating point of a Josephson junction in the normal conducting state can easily be defined graphically. The current, $I_{RL}$, flowing through the parallel load impedance, $R_L$, is added graphically to the current, $I_J$, flowing through the Josephson junction. The load line runs through the origin and forms an angle $\phi$ with the abscissa, whereby the contangent of that angle corresponds to the load impedance. In the new oblique system of coordinates, the voltage drop, $(I_J + I_{RL}) \cdot R_S$, occuring across the source impedance, $R_S$, is subtracted from the energy gap voltage, $V_G$, to define the operating point. One can see therefrom that suitably the source impedance is very low, however, it must have a certain minimum value.

Figure 3:
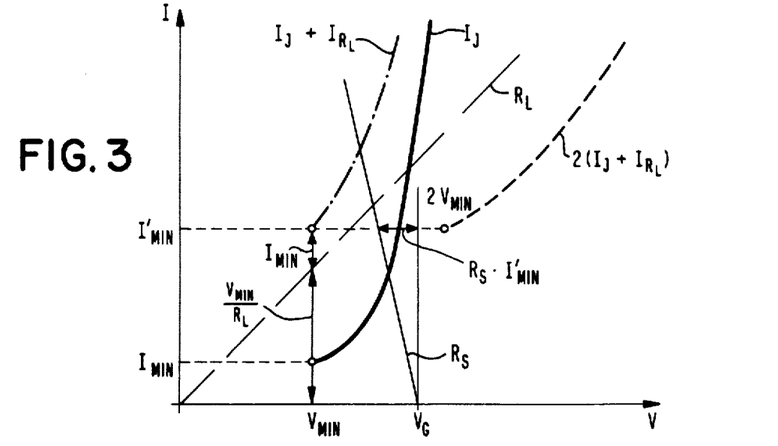
FIG. 3 shows I-V characteristics of a Josephson element which explains the conditions for the minimum voltage, $V_{min}$, which allows a Josephson element to reset automatically from the normal conducting state to the superconducting state.

The reset voltage, $V_{MIN}$, lies in about the order of magnitude of half the energy gap voltage, $V_G$. The minimum voltage, $V_{MIN}$, at which an automatic resetting of the Josephson element from the normal conducting state to the superconducting state is possible can easily be estimated. FIG. 3 which shows several current-voltage characteristics useful for that purpose serves for the explanation. $I_J$ designates that branch of the characteristic which represents the current flowing through the Josephson junction in the normal conducting state. Here the load line corresponding to the load impedance, $R_L$, is drawn running positively in the first quadrant. The straight line corresponding to the source impedance, $R_S$, runs upwardly from point, $V_G$, at the abscissa. The current flowing through the load impedance which is connected in parrallel to the Josephson junction and which relates to a certain voltage V can be read as the ordinate of the load line. In the example drawn in the figure at voltage $V_{MIN}$, the current flowing through the load impedance is $V_{MIN}/R_L$. If one adds graphically to this value the current, $I_{MIN}$, flowing through the Josephson junction, a point is reached which is designated here by $I'_{MIN}$. In this way a further characteristic — drawn as dash-dot line — can be determined as current flowing through the parallel connection of Josephson junction and load impedance. In FIG. 3, that characteristic is designated as $I_J+I_{RL}$. The operating conditions can be read for that Josephson gate being just in the normal conducting state. The other Josephson gate of both Josephson elements connected in series is in the superconducting state at this time, so no voltage drop occurs across it and that the complete voltage available now feeds the parallel connection of the normal conducting Josephson element with its related load impedance. To estimate the lower limit of $V_{MIN}$, a further characteristic 2 ($I_J+ I_{RL}$) is drawn in the figure in dashed lines. That current would flow if both Josephson elements were in the normal conducting state at the same time. However, the voltage available at the series connection equals the source voltage minus the voltage drop at the source impedance, i.e., in that case $V_G-R_S \cdot I'_{MIN}$. As can easily be seen from FIG. 3, twice the reset voltage, $2V_{MIN}$, must be greater than the voltage available in order to guarantee that only a single Josephson element can exist in the normal conducting state. From this requirement, $2V_{MIN}>V_G-R_S \cdot I'_{MIN}$, the condition for the minimum reset voltage can easily be derived. One inserts the value drawn in the figure $I'_{MIN} \approx I_{MIN}+V_{MIN}/R_L$ resulting as condition for the minimum reset voltage: $V_{MIN}>(-V_G-R_S \cdot I_{MIN})/(2+R_s/R_L)$.

For a rough calculation one can use, e.g., the following values. The internal voltage drop may amount about 6%, i.e., $R_S \cdot I_{MIN} \approx 0.06\ V_G$. The ratio of the source impedance, $R_S$, to load impedance, $R_L$, may be 1:4. The resulting minimum value of the reset voltage is $V_{MIN}>0.42 \cdot V_G$. One can see therefrom that the minimum reset voltage can be smaller than even half the energy gap voltage. Those conditions can easily be fulfilled with Josephson junctions operating at not too high current densities. Suitably so called long Josephson junctions are used whose length dimenson in the direction of the flowing current is about three times the Josephson penetration depth.

Figure 4:
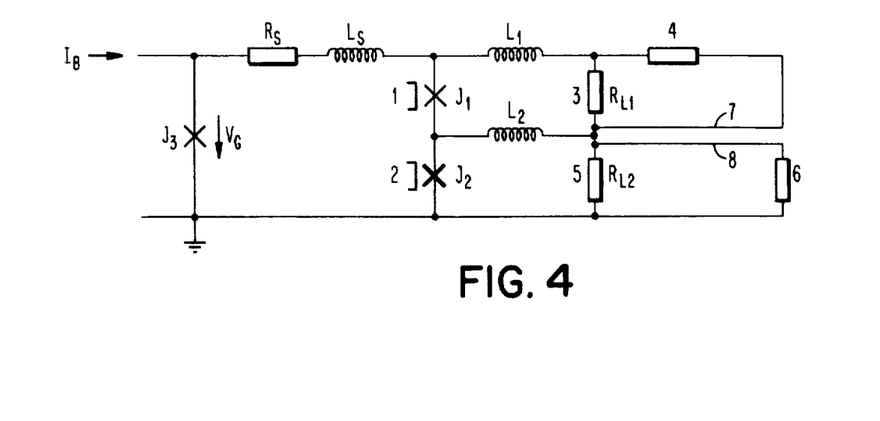
FIG. 4 shows schematically the circuit diagram of a bistable circuit.

FIG. 4 shows the circuit diagram of a bistable circuit, aa so called flipflop. The bistable trigger circuit is built electrically in a completely symmetric manner. Two Josephson gates, $J_1$ and $J_2$, having properties as similar as possible are connected in series to the feeding voltage, which corresponds to the energy gap voltage, $V_G$. To stabilize the feeding voltage a ground through a further Josephson element $J_3$ is provided. Element $J_3$ consists of a Josephson junction designed in such a way that normally it exists in the normal conducting state. Hence the voltage drop occurring across that third Josephson element always corresponds to the energy gap voltage, $V_G$. In this instance, a separate control line need not be provided for that third Josephson element. However, the Josephson gates of the bistable circuit are provided with control lines.

A control line 1 is arranged over Josephson gate, $J_1$, and a control line 2 is disposed over Josephson gate $J_2$. Here the symbol for a control line designates generally a control device or control means comprising one or more such control lines which may be provided according to the circumstances involved. Here the load impedance consists of several resistances and of an inductance. Load impedance, $R_{L1}$, of Josephson gate, $J_1$, comprises resistances 3 and 4, and the inductance, $L_1$. Load impedance $R_{L2}$ of second Josephson gate, $J_2$, comprises resistances 5 and 6, and the inductance $L_2$. Also the source impedance, $R_S$, contains an inductive part which is designated here by $L_S$. In practice, strip lines show inductance per se, so that the impedances always comprise inductive parts too. Such inductances favor the automatic resetting of the Josephson element into the superconducting state.

When a d.c. voltage is present across a Josephson junction, and this is true in the so called normal conducting state, then an a.c. voltage of very high frequency is generated also due to the a.c. Josephson effect. That frequency is about 483 Gigacycles per second at a voltage of 1 mV. The gap voltage is about 2.6 mV is generally used materials. The reset voltage is of the order of magnitude of about half the gap voltage. Sufficient inductance must be present in the circuit to attenuate a.c. voltages which could occur.

Sometimes it is desirable to divide the load impedance. The current available in an output line needs only be sufficient to control one or more following binary circuits. With a given switching state of the binary circuit of FIG. 4, one of the Josephson elements is always superconducting and the other one is normally conducting. Therefore, the true signal and its complement signal are always available at the load impedances, $R_{L1},R_{L2}$. To control following stages an output line is used where the terminating resistance is grounded. In the embodiment shown in FIG. 4, the first load impedance, $R_{L1}$, is divided into resistances 3 and 4. However, a separate return conductor 7 is necessary here which leads back to the node between both Josephson elements. The second load impedance, $R_{L2}$, is divided into resistances 5 and 6 and resistance 6 may be a grounded terminating resistance. Therefore, line 8 is suitably chosen as output line of the binary circuit to control following stages. In this instance, a separate return conductor is not necessary, because a grounded ground plane can serve as common return conductor.

As soon as voltage, $V_G$, is available, the bistable trigger circuit of FIG. 4 is in one of two possible switching states. Either the first Josephson element is in the superconducting state and the second Josephson element in the normal conducting state, vice versa. To switch the trigger circuit, a control current is applied to the control line of the Josephson element which is in the superconducting state. The maximum Josephson current of that element is decreased by the control current magnetic field so that it switches to the normal conducting state. At the same time the other Josephson element of the binary circuit is forced to switch into the superconducting state.

Figure 5:
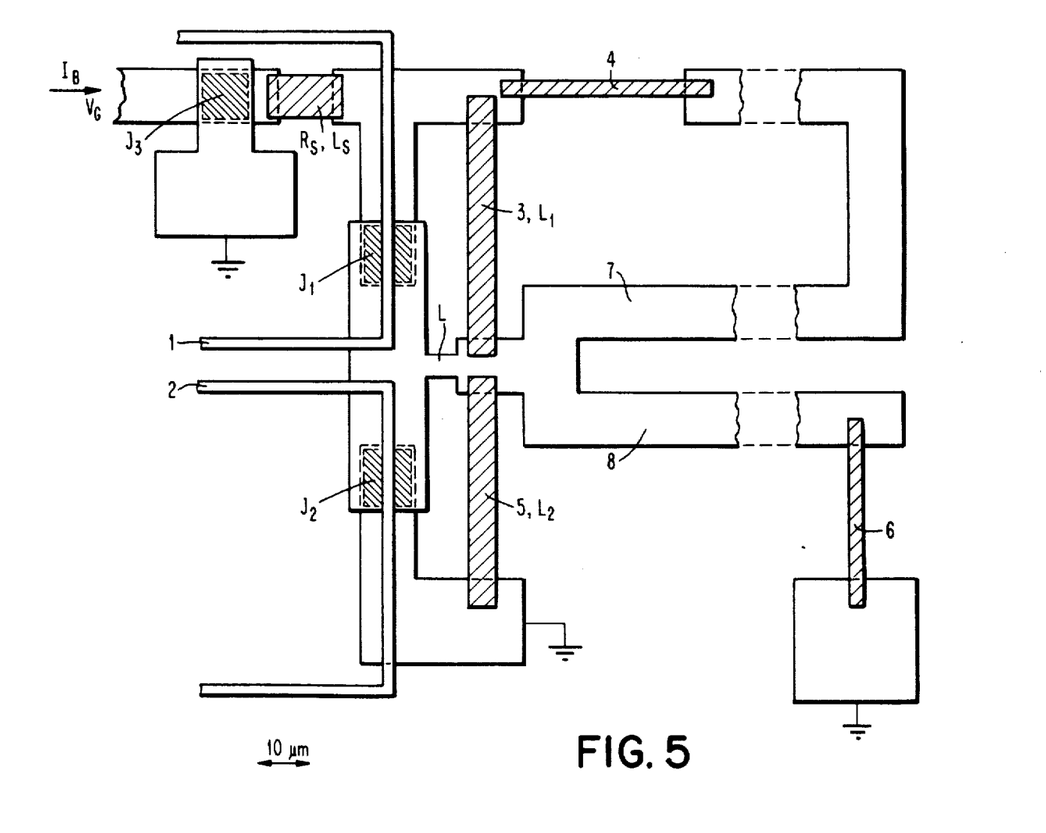
FIG. 5 shows a layout of the bistable circuit of FIG. 4 in the integrated circuit environment.

FIG. 5 shows an example of how the circuit of FIG. 4 may be implemented in the integrated circuit environment. Similar parts in FIG. 5 are designated with same reference characters used in FIG. 4. The circuit is arranged on a superconductive ground plane (not shown), which may be made of niobium, for example. A first isolating layer (not shown), e.g., of niobium oxide, covers the base plate. Tthen metal strip patterns are produced forming the superconductive leads and the lower electrodes of the Josephson junctions. Beginning from the upper left in FIG. 5, these are the supply line for the feeding current, $I_B$, onto which the Josephson junction, $J_3$, is formed to stabilize the feeding voltage to the value of the energy gap voltage, $V_G$. Next, a T-shaped part is shown onto which the Josephson junction of the Josephson gate, $J_1$, is formed. On the bottom of FIG. 5, an L-shaped part for the junction of Josephson gate, $J_2$, and the ground connection to the ground plane is formed. In the same metallization step, the square part on the bottom right is formed which connects the terminating resistance 6 to the ground plane. That metallization may consist, e.g., of lead alloys. In the cross-hatched areas of FIG. 6 associated with devices $J_1-J_3$ oxide layers are produced. Lead oxide or indium oxide may be used for the Josephson junctions $J_1, J_2$, and $J_3$. Another metallization step using alloys forms other circuit portions. A first T-shaped part forms the counter electrode of junction $J_3$ and connects Josephson junction $J_3$ with the ground plane for the stabilization of the feeding voltage. Another portion of the same metallization forms the upper electrode of Josephson gates, $J_1$ and $J_2$, as well as lines 7 and 8. In another fabrication step, the resistances 3, 4, 5, 6, and $R_S$ are evaporated from suitable materials. The metal strips forming the resistances are smaller than the rest of lines and, therefore, they provide the necessary inductance. If the circuit inductance must be increased, necked down line portions L shown at the node between both Josephson elements $J_1$ and $J_2$ can be inserted where required. An isolating layer (not shown) covers the circuit, e.g., of silicon oxide. Then control lines 1 and 2 are produced above that isolating layer.

The Josephson junctions are operated with current densities equal to or less than 10kA/cm$^2$. With this current density, the Josephson penetration depth of the materials is 4 microns. The oxide layers of the Josephson junctions are about 12 microns long. Therefore, the junctions are so called long Josephson junctions because they are three times the Josephson penetration depth. The junction width is about 10 microns. The resitivity of the source impedance is about 0.05 $\Omega$. The load impedances are each divided into parallel connected resistances 3 and 4, or 5 and 6. The partial resistances 3 and 5 which are arranged adjacent to the Josephson elements, have the value of about 0.5 $\Omega$. The in-line resistance 4 at Josephson element $J_1$, or the terminating resistance 6 of the output line 8, respectively, have 0.8 $\Omega$ each. Therefore, each load impedance consists of a parallel connection of 0.5 and 0.8 $\Omega$ resulting in a total resistance of 0.31 $\Omega$. The normal tunnel resistance of the Josephson junctions used is about 0.17 $\Omega$, the maximum Josephson current about 8 mA. All these values are merely exemplary. In practice, deviations from these values may occur naturally since these values also depend on the materials used and on the details of the design.

The above described binary circuitry can also be built as monostable trigger circuit which can be used as logic gate for carrying out the functions AND, OR, NAND or NOR.

Figure 6:
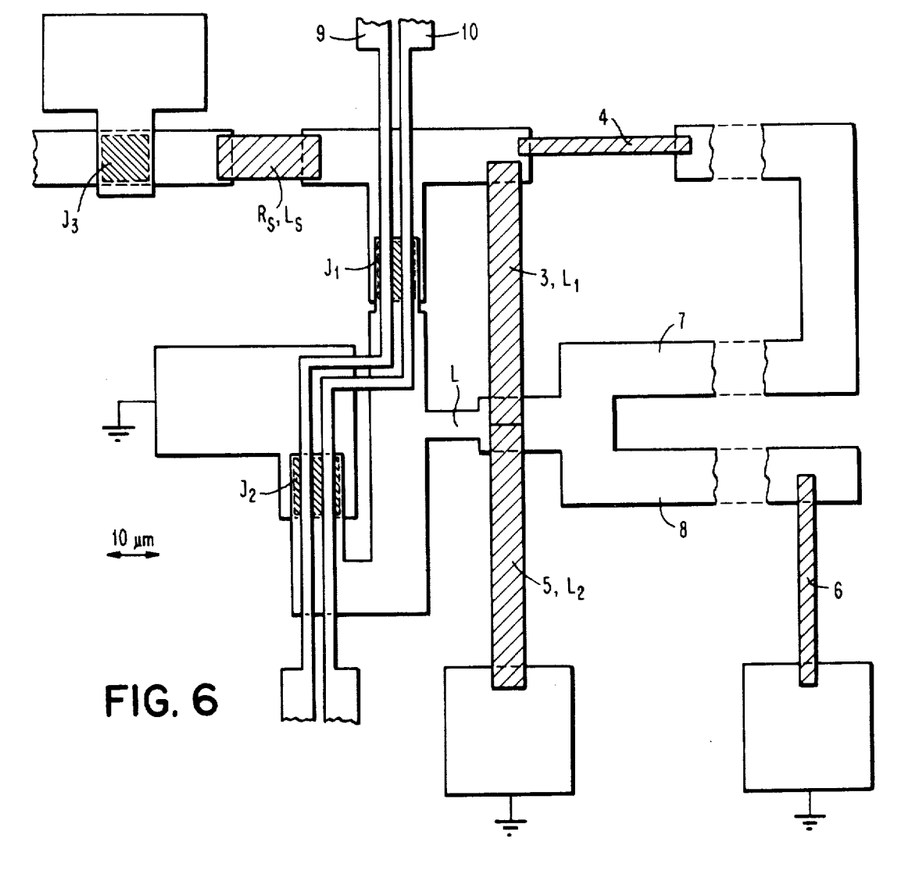
FIG. 6 shows a layout of a logic gate of FIG. 7 in integrated circuit environment.
Figure 7:
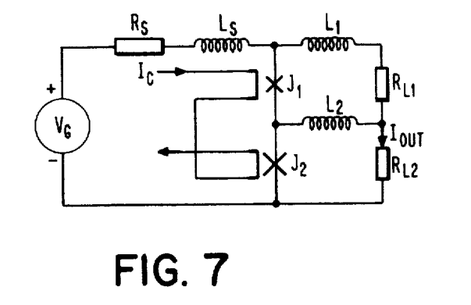
FIG. 7 shows a schematic diagram of the circuit of FIG. 6 in the form of an AND-gate or an OR-gate.
Figure 8:
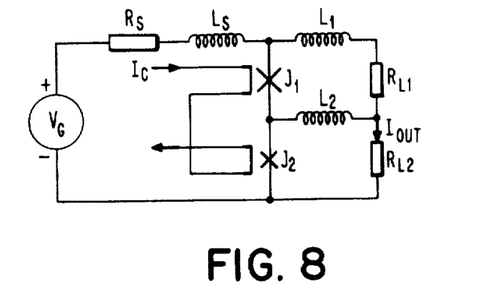
FIG. 8 shows a schematic diagram of the circuit of FIG. 6 as inverting logic gate which can carry out the logic NAND function or NOR functions.

Embodiments of these circuits are shown in FIGS. 6, 7 and 8. FIG. 6 shows a possible layout in the integrated circuit environment. The same reference characters as used in previous figures identify the same elements. Control lines 9 and 10, whose purpose and operating mode is explained with the aid of FIGS. 7 and 8, appear for the first time in FIG. 6. In addition, the area of Josephson junction $J_1$ is smaller than the area of Josephson junction, $J_2$. This fact is indicated in the circuit diagram of FIG. 7 in that $J_1$ is drawn with a smaller symbol and $J_2$ with a larger symbol.

In this way, an artificial asymmetry is created to make the binary circuit monostable. This can be done in several ways, for instance, by different load impedances or by additional controlling currents. If the desired switching behavior is known when designing the circuit, the preferred approach is to use the structural changes in the circuits themselves. By proper dimensioning, the circuit arrangement with Josephson elements, $J_1, J_2$, having different Josephson junctions areas can be provided causing a predetermined Josephson element, here the one having the smaller junction area, to go into the normal conducting state whenever the feeding voltage is switched on.

In FIG. 7, the control line is designed so that it acts in an opposite sense on both Josephson gates, $J_1, J_2$, of the binary circuit. As can be seen from the circuit diagram of FIG. 7, control current $I_C$ at the first Josephson gate, $J_1$, flows parallel to the direction of the current through the Josephson junction, which current flows from the positive terminal to ground. However, the current direction is inverted in the control line of the Josephson gate, $J_2$, so that here the control current runs in an opposite sense relative to the direction of current through Josephson junction, $J_2$. In a practical design, a control line forming loops is avoided, because a larger number of fabrication steps would be necessary in view of the isolating layers needed. Instead Josephson gate, $J_2$, is designed as shown in FIG. 6, so current through device, $J_2$, is opposite to the flow of current in the control lines. Thus, loopless control lines 9 and 10 can be employed. In these control lines, a control current, $I_C$, has the effect that the maximum Josephson current of the Josephson gate having the smaller junction area is increased, and that the maximum Josephson current of the Josephson gate having the larger junction area is decreased. Hence, the switching state of both Josephson elements connected in series is inverted by the application of a control signal. Also, it should be appreciated that the term control current means the effective control current, i.e., the sum of all control currents either in separated control lines or coupled galvanically in a single common control line only.

An output signal is produced by the current, $I_{OUT}$, flowing through the load impedance, $R_{L2}$, or the terminating resistance 6. At the node between output line 8 and the grounded common return conductor of the ground plane, the output signal formed by that current, $I_{OUT}$, can be used as control current for following circuits. According to the circuit diagram of FIG. 7 the asymmetry of the binary circuit is chosen such that the true output signal occurs at the terminating resistance. That logic gate can be used to perform the logic functions AND or OR.

The control current, $I_C$, may be the effective input signal made up of several signals. If the circuit has to perform an AND function, then it is designed in such as way that only the sum of all input signals effects an output signal. The threshold value is changed for performing the OR function. Here an output signal is effected already when a single input signal is applied.

An embodiment according to the circuit diagram of FIG. 7 operates in the following way. When only the voltage, $V_g$, is applied and there is no input signal present, Josephson gate, $J_1$, is in the normal conducting state and Josephson gate, $J_2$, is in the superconducting state. Thus, the superconducting Josephson gate, $J_2$, shorts out load impedance, $R_{L2}$. Therefore, no voltage drop occurs there, and no output signal can be obtained. When the effective input signal, i.e., the sum of all input signals effects switching of the binary circuit, Josephson gate, $J_1$, becomes superconducting and Josephson gate, $J_2$, passes over to the normal conducting state. Now a voltage is present across load impedance $R_{L2}$, so that there an output signal can be collected. That binary circuit produces true, non-inverted output signals and can function as AND gate or as OR gate.

In the embodiment according to the circuit diagram of FIG. 8, Josephson gate, $J_1$, is provided with a large area Josephson junction and Josephson gate, $J_2$, is provided with a small area Josephson junction. That binary circuit operates in a manner opposite to the circuit of FIG. 7 and delivers inverted or complement output signals. It is suitable to perform the logic functions NAND or NOR. When only the feed voltage is applied to that circuit and no effective input signal is present, Josephson gate, $J_1$, is superconducting and Josephson gate, $J_2$, is normal conducting. A voltage is present at load impedance $R_{L2}$ and hence an output signal. However, because no input signals are present at that time, this output signal is an inverted output signal. If the circuit is switched by an effective input signal, Josephson gate, $J_1$, switches to the normal conducting state, and Josephson gate, $J_2$ to the superconducting state. Now no voltage is present across load impedance $R_{L2}$, so that the circuit is operating as inverter or it delivers the NAND function or the NOR function according to the connection of input signals and what type of circuit design is chosen.

If the electrical asymmetry is effected by different Josephson junction areas to make the binary circuit feasible as logic gate, the area ratio is chosen about 0.6 : 1 for an AND gate and a NAND gate, respectively. The junction area ratio is chosen about 0.8 : 1 for an OR gate and a NOR gate, respectively.

Figure 9:
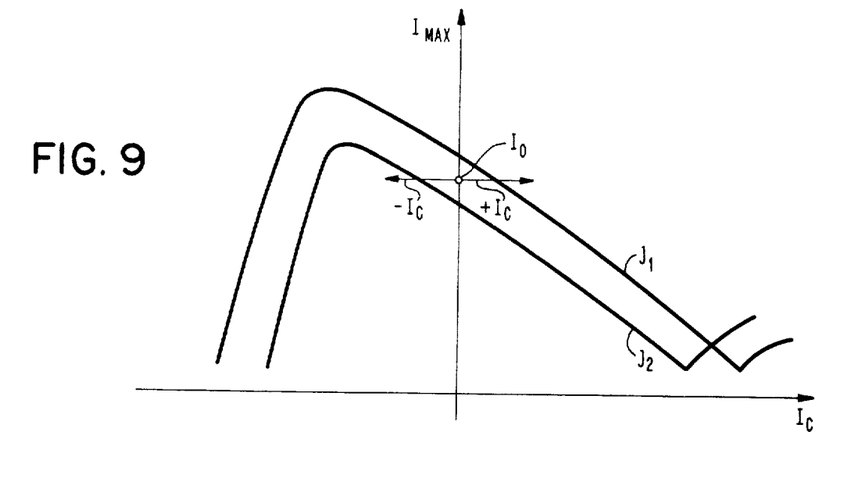
FIG. 9 shows the control characteristics ($I_g$ vs. $I_c$) of the logic gate of FIG. 6.

The dimensioning of these embodiments corresponds to about the values of the bistable trigger circuit described above with the aid of FIGS. 4 and 5. The maximum Josephson current is about 6 mA for the Josephson gate having the smaller junction area, it is about 8 mA for the larger area Josephson junction. The load resistances are chosen such that the Josephson element being in the superconducting state draws a current of about 7 mA. At an effective control current of more than 1.25 mA the large area Josephson gate switches into the voltage state and the small area Josephson element becomes superconducting automatically. FIG. 9 shows schematically the control characteristics of the inverting gate according to the embodiment of FIG. 8. The curves show the dependence of the maximum Josephson current, $I_{MAX}$, on the effective control current, $I_C$. The curve with the higher values of Josephson current belongs to the large area Josephson gate, $J_1$. The curve with the smaller values belongs to the small area Josephson gate, $J_2$. The feed current $I_0$ which is flowing through both series connected Josephson junctions in the absence of control currents, is chosen such that the operating point lies just between both characteristics in the quiescent state. At that current value, the maximum Josephson current is just exceeded for the smaller Josephson junction of gate, $J_2$, so that this Josephson gate, $J_2$, is in the voltage state or normal conducting state. However, the maximum Josephson current has not yet been exceeded by the Josephson junction of gate $J_1$. Josephson gate, $J_1$, is in the superconducting state.

No control current $I_C$ is flowing, because there are no binary signals to be connected at the inputs. However, an output signal can be generated in view of the output current, $I_{OUT}$, flowing through load $R_{L2}$. An effective control current, $I_C$, flows when input signals are connected together according to the NAND function or to the NOR function. Due to the kind of conductor arrangement that control current provides a field which has one direction in one Josephson element and the opposite direction in the other Josephson element. In the drawing, this fact is designated by $+I_C$ or $-I_C$, respectively. In Josephson gate, $J_1$, the sum of $I_0$ and $+I_C$ has the effect that the maximum Josephson current is exceeded. Element $J_1$ switches to the normal conducting state. The current effective in Josephson gate, $J_2$, is the combination of $I_0$ and $-I_C$. That element is switched to the superconducting state. In this way, load $R_{L2}$ is shorted, so that no output signal can be provided. The binary circuit operates as inverting logic gate.

A certain drawback of the described circuit resides in the fact that the operating parameter tolerances of the operating point are relatively close due to the small differences of the characteristics of both Josephson gates involved. Possibly some improvements can be achieved by using other regions of the characteristics. For instance, the operating point can be transferred into the steep part of both characteristics by an additional bias current.

Figure 10:
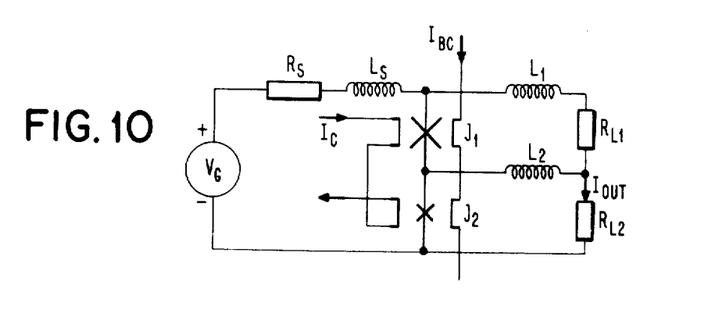
FIG. 10 shows a schematic diagram of a further embodiment of a logic circuit having an additional control line to apply a basis control circuit, $I_{BC}$.
Figure 11:
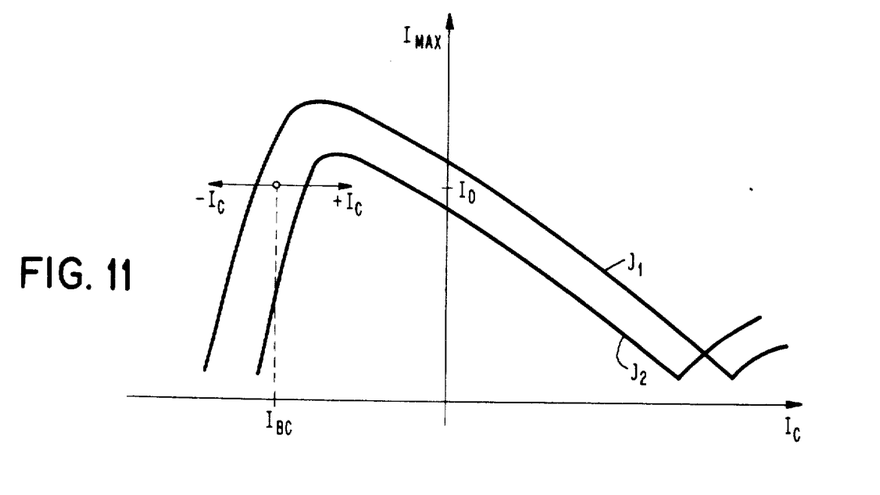
FIG. 11 shows the control characteristics ($I_g$ vs. $I_c$) of the logic circuit of FIG. 10.

FIG. 10 shows the circuit diagram of an inverting logic gate, which is provided with an additional control line over both Josephson gates. A bias control current, $I_{BC}$, is sent through these control lines. As can be seen from the characteristics in FIG. 11, in the quiescent state that additional bias control current, $I_{BC}$, transfers the operating point between the steep part of both characteristics. Now fluctuations of the feed current $I_0$ are less deleterious. For the rest, the operation method of that circuit corresponds to that of the embodiment described with the aid of FIGS. 8 and 9.

Figures 12, 13:
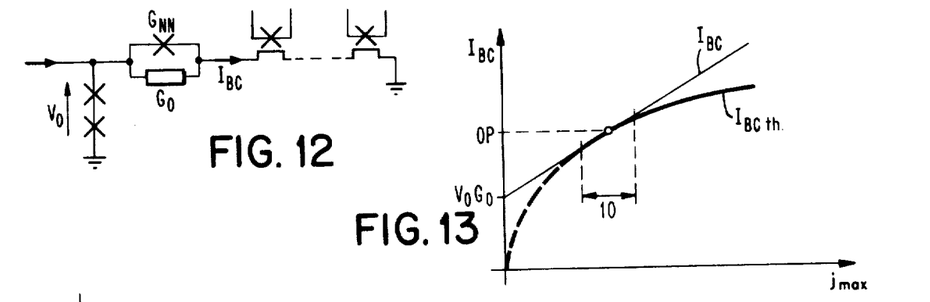
FIG. 12 shows an example of a circuit which provides for the stabilization of the bias control current, $I_{BC}$.
FIG. 13 is a graph of $I_{BC}$ vs. $j_{max}$ which explains the operation mode of the stabilization circuit of FIG. 12.

Bias control current, $I_{BC}$, may be stabilized so that variations of the current density of the maximum Josephson current are equalized automatically. According to FIG. 12 that stabilizing circuit comprises a resistance and an additional Josephson junction connected in parallel within the line carrying the current $I_{BC}$. This circuit is fed by a voltage higher than the energy gap voltage. Suitably that voltage, $V_0$, is chosen twice the gap voltage. In this instance, it is obtained by two normal conducting Josephson junctions connected in series. FIG. 13 serves for an explanation and shows the bias control current, $I_{BC}$, is a function of the maximum current density of the Josephson current, $_{max}$. In long Josephson junctions as thay are preferred in the described binary circuit, the maximum Josephson current, $I_{MAX}$, is proportional about to the square root of the current density, $j_{max}$. Possibly the bias control current, $I_{BC}$, should show a similar dependency from the current density. At a voltage, $V_O$, in the order of magnitude of twice the gap voltage, the normal tunnel conductance, $G_{NN}$, of a Josephson junction is proportional to the current density, $J_{max}$. A parallel resistance is necessary for the approximation of the current $I_{BC}$ in a certain range 10 around the operating point OP The stabilization circuit characteristic should be tangent to the $I_{BC}$ characteristic at the operating point. At the current density O the line intersects the current axis at the valve $V_O G_O$. It can be determined easily, that for this conductivity value, $G_O$, a resistance is necessary of the same value as the tunnel resistance of the stabilizing Josephson junction. The values $G_{NN}$ and $G_O$ should be suitably of same order. It is only necessary for that stabilization circuit, that the maximum current densities $j_{max}$ of the various Josephson junctions should be of same order on the same chip. The thus gained bias control current, $I_{BC}$, can be used by several logic circuits at the same time.

Figure 14:
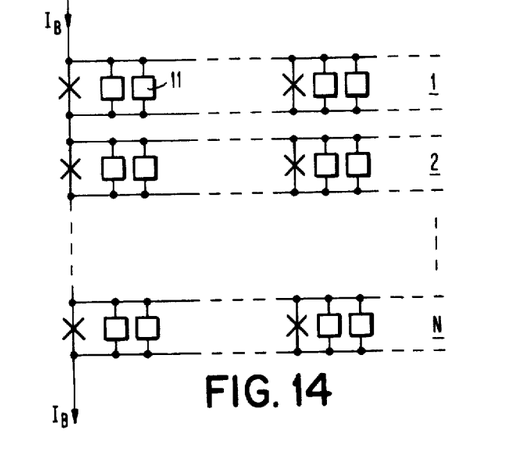
FIG. 14 shows schematically an example of a common power supply circuit for a number of binary circuits in several planes, whereby, in each plane, groups of binary circuits share a common voltage stabilization circuit.
Figure 15:
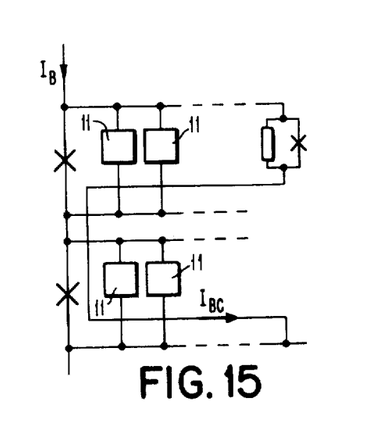
FIG. 15 shows schematically an example of a circuit wherein, a power supply according to FIG. 14, a voltage is obtained which, in turn, can be utilized to stabilize the bias control current of the arrangements of FIGS. 12 and 13.

The common power supply of a large number of binary circuits is applicable to groups of logic circuits. FIG. 14 shows schematically an example of such a power supply circuit. Each plane 1 – N contains a block of about 1000 circuits generally designated with reference number 11. The individual planes 1 – N are connected in series and they are inserted into the power supply line which supplies the feed current $I_B$. In each plane, the binary circuits 11 are fed in parallel by the feed voltage corresponding to the energy gap voltage, $V_G$. To stabilize the feed voltage within the plane some groups share a common circuit. This stabilization circuit is indicated by the symbol of a slanted cross which symbolizes the normal conducting Josephson junction necessary for the stabilization. Each of that planes has another potential due to the series connection of such planes within the power supply line. This fact can be utilized for the supply of the control current $I_B$. As shown in FIG. 15 the voltage $V_O$ is obtained as the potential difference between two adjacent planes, which voltage is twice the energy gap voltage used to feed the stabilization circuit according to FIGS. 12 and 13. To supply the bias control current $I_{BC}$ a resistance and a Josephson junction are connected in parallel to the input line of a first plane and to the return conductor of a second adjacent plane. Such a circuit supplies all binary circuits 11 of both adjacent planes with the bias control current $I_{BC}$.

Figure 16:
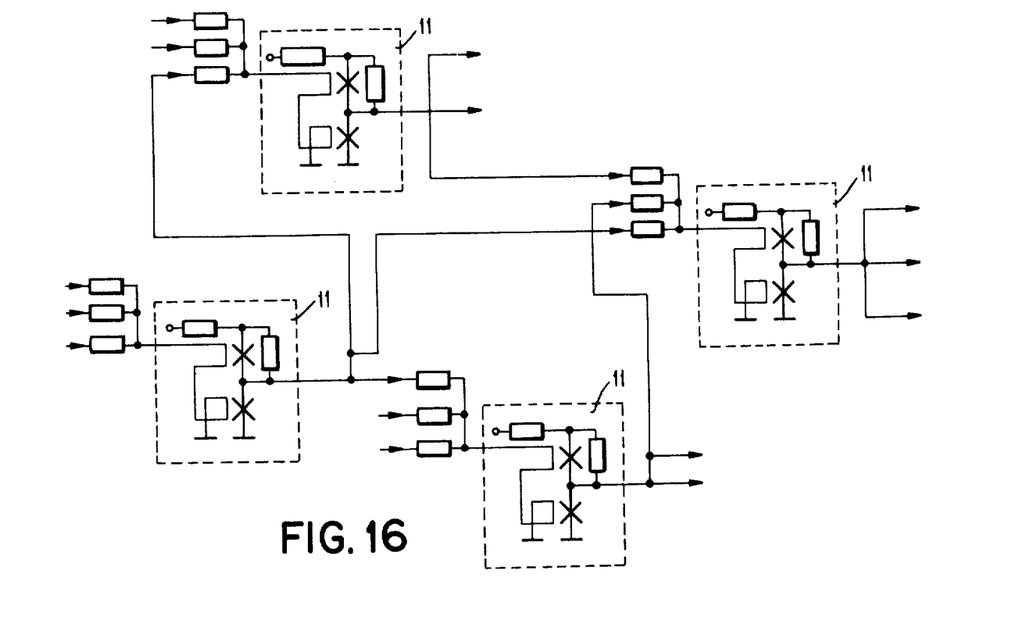
FIG. 16 shows schematically how to connect several binary circuits.

When the described binary circuit is switched a relatively strong current is transferred into the load impedance. That current is more than three times as large as necessary to control following currents of the same kind. Therefore the output current of one binary circuit can be separated into three parts, whereby each of these output currents may control a further switching circuit. It is suitable to terminate each of that output lines by a resistance of three times the value of the load impedance and to connect it in series to the control line of a following switching circuit. That concept allows to couple control currents galvanically, so that the actual Josephson gates are provided with a single control line in practice. FIG. 16 shows schematically such an example how to connect several binary circuits with each other. According to the chosen design each of these circuits 11 may practice either of the logical connections according to the OR, NOR, AND, or NAND function.

At the last mentioned example of logic gates connected with each other, one of the load impedances is designed in another form as described above. The circuit described above acts as a load impedance for the output line which is terminated by a resistance and which is connected to earth via the control line of a following logic gate. Differently dimensioned load impedances may also be used to make the binary circuit monostable although it is provided with equal area Josephson junctions. The necessary asymmetry can also be achieved by providing only a single one of a pair of Josephson gates with an additional bias control current. This can be done by a separate control line or by coupling galvanically an additional current into one of both control lines of a Josephson gate pair. Another possibility is an additional bias control current acting in opposite sense in both Josephson gates. For instance, with such a current a symmetric bistable circuit can be made asymmetric and monostable. On the other hand, such a control current may also be used in such a way that an originally monostable circuit is changed electrically into a bistable circuit. In this way, the asymmetry caused by differently designed areas of Josephson junctions may be changed electrically. Also, the threshold value may be changed to react on control signals, so that an AND gate is changed into an OR gate, or vice versa.

A complete family of binary switching circuits can be designated by suitably utilizing and combining all the possibilities enumerated. The common feature of all these circuits is the basic circuit including both series connected Josephson gates fed by a source which equals the gap voltage. Memory circuits, counters, shift registers and the like can be built. Further all kind of logic gates can be designed, which may execute arithmetical operations. Besides these named logical circuits, adder circuits may be designed too according to the principles of the described binary circuitry.

While the invention has been particularly shown and described with reference to preferred embodiments thereof, it will be understood by those skilled in the art that various changes in form and detail may be made therein without departing from the spirit and scope of the invention.

What is claimed is:

1. A switching and storage circuit comprising:
 a pair of series connected self-resetting Josephson elements each having zero and finite voltage states,
 a load impedance shunting each of said pair of Josephson elements,
 a common connection disposed between said load impedances and said Josephson elements, and
 voltage means connected to said pair of Josephson elements for applying a maximum constant voltage of the order of the gap voltage of one of said elements thereto which sets one of said Josephson elements into said finite voltage state, and
 control means coupled to said pair of Josephson elements for switching said one element from said finite voltage state to the zero voltage state and the other of said pair of elements from the zero voltage state to the finite voltage state.

2. A switching and storage circuit according to claim 1 wherein said Josephson elements have junctions of equal area.

3. A switching and storage circuit according to claim 1 wherein said Josephson elements have junctions of different areas.

4. A switching and storage circuit according to claim 1 wherein said load impedances have the same value.

5. A switching and storage circuit according to claim 1 wherein said load impedances have different values.

6. A switching and storage circuit according to claim 1 wherein said control means includes at least one control line coupled to at least one of said Josephson elements.

7. A switching and storage circuit according to claim 1 wherein said control means includes at least one control line separately connected to each of said Josephson elements.

8. A switching and storage circuit according to claim 1 wherein said control means includes means for applying equal control currents to each of said Josephson elements.

9. A switching and storage circuit according to claim 1 wherein said control means includes means for applying different control currents to each of said Josephson elements.

10. A switching and storage circuit according to claim 1 further including means for biasing at least one of said Josephson elements to adjust the switching threshold of said at least one of said Josephson elements.

11. A switching and storage device according to claim 1 wherein said control means includes a plurality of control lines associated with at least one of said Josephson elements and means for applying an input signal to at least one of said plurality of control lines to obtain the true and complement of said input signal at said load impedances.

12. A switching and storage device according to claim 1 wherein said control means includes a current carrying conductor which is disposed adjacent said Josephson elements, the current through which flows in the same direction as current flowing through one of said Josephson elements and flows in the opposite direction relative to the flow of current through the other of said Josephson elements.

13. A binary switching and storage circuit according to claim 1 further including an inductance in series with one of said load impedances, an inductance disposed in said common connection and an inductance disposed in series with said voltage means.

14. A binary switching and storage circuit according to claim 1 wherein said one of said Josephson elements if reset from the finite voltage state to the zero voltage state after switching in response to actuation of said control means automatically when the following relationship is obtained:

$$V_{MIN} > \frac{(V_G - R_S \cdot I_{MIN})}{(2 + R_S/R_L)}$$

where $V_{MIN}$ = MINIMUM JOSEPHSON VOLTAGE
$V_G$ = GAP VOLTAGE
$R_S$ = SOURCE IMPEDANCE
$R_L$ = LOAD IMPEDANCE
$I_{MIN}$ = MINIMUM JOSEPHSON CURRENT 15. A binary switching and storage circuit according to claim 1 wherein said voltage means includes a Josephson device in the finite voltage state connected in parallel with said pair of Josephson elements said device providing a stable voltage, $V_G$, the energy gap voltage.

16. A binary switching and storage circuit according to claim 1 wherein said control means includes a plurality of conductors the simultaneous application of input signal thereto switches at least one of said Josephson elements, the latter having a junction area ratio of 0.6 : 1.

17. A binary switching and storage circuit according to claim 1 wherein said control means includes a plurality of conductors the application of an input signal to any one of said plurality switches at least one of said elements, the latter having a junction area ratio of 0.8 : 1.

18. A binary switching and storage circuit according to claim 10 wherein said means for biasing includes a control line coupled to said pair of Josephson elements and a voltage source, a parallel combination of a Josephson junction in the finite voltage state and a resistance having a value equal to the resistance of a Josephson junction in the finite voltage state in series with said source, and a pair of Josephson devices in the finite voltage state for stabilizing said voltage source.

19. A binary switching and storage circuit according to claim 14 wherein the ratio of source impedance to load impedance, $R_S:R_L$, is 1 : 4.

20. A Josephson junction circuit comprising:
a first self-resetting device capable of carrying Josephson current,
at least a second self-resetting device capable of carrying Josephson current disposed in series with said first device,
means connected to said devices for developing a voltage drop of the order of the gap voltage of one of said devices and below across said devices, and
means connected to said devices for switching the states of both of said devices, said voltage drop across said devices remaining constant.

21. A Josephson junction circuit according to claim 20 wherein said means for developing a voltage drop of the order of the gap voltage of one of said devices and below includes a Josephson junction having a maximum voltage equal to the gap voltage of one of said devices.

22. A Josephson junction circuit according to claim 20 wherein said means for developing a voltage drop of the order of the gap voltage of one of said devices and below includes a voltage source.

23. A Josephson junction circuit according to claim 20 wherein said means for switching the states of both of said devices includes at least a single control line electromagnetically coupled to said devices.

24. A Josephson junction circuit according to claim 20 further including a load impedance connected across each of said devices.

25. A Josephson junction circuit according to claim 24 further including a connection disposed between the common connections of said load impedances and said devices.

26. A Josephson junction circuit comprising:
a first self-resetting device capable of carrying Josephson current,
at least a second self-resetting device capable of carrying Josephson current disposed in series with said first device one of said first and said at least a second device being in the voltage state while the other of said devices is in the zero voltage state, and,
means for maintaining a substantially constant voltage across said devices of the order of the gap voltage of one of said devices and below when said first device and said at least a second device are switched.

27. A Josephson junction circuit according to claim 26 further including means connected to said first and second devices for switching said devices.

* * * * *